United States Patent [19]
Castellucci

[11] Patent Number: 5,986,511
[45] Date of Patent: Nov. 16, 1999

[54] FREQUENCY DEPENDENT IMPEDANCE

[75] Inventor: Gregg R. Castellucci, Plattsburgh, N.Y.

[73] Assignee: International Business Machines Corporation, Armonk, N.Y.

[21] Appl. No.: 08/960,478

[22] Filed: Oct. 31, 1997

[51] Int. Cl.[6] .............................. H03F 3/08; H01J 40/14
[52] U.S. Cl. ...................................... 330/308; 250/214 A
[58] Field of Search ................ 330/59, 308; 250/214 A; 359/189

[56] References Cited

U.S. PATENT DOCUMENTS

| | | |
|---|---|---|
| 4,139,767 | 2/1979 | Witkowicz ............................ 250/214 A |
| 5,296,687 | 3/1994 | Moses, Jr. ............................ 250/214 R |

*Primary Examiner*—Robert Pascal
*Assistant Examiner*—Patricia Nguyen
*Attorney, Agent, or Firm*—Eugene I. Shkurko

[57] ABSTRACT

An apparatus for providing a varying impedance point in a circuit corresponding to a frequency of an input signal applied to the apparatus. Device sizes of the apparatus can be selected to provide varying impedance for desired frequency ranges.

3 Claims, 3 Drawing Sheets

A) INDUCTIVE  B) RESISTIVE  C) DIODE

FIG.3b — TRANSIMPEDANCE AMP Zin <100 ohms

FIG.3c — Vcc FILTER, S. E. TRANSIMPEDANCE AMP

FREQUENCY DEPENDENT IMPEDANCE

BACKGROUND OF THE INVENTION

1. Technical Field of the Invention

This invention pertains to integrated circuits. In particular, this invention pertains to a frequency dependant impedance device for providing a high impedance point in a circuit without requiring off chip components.

2. Background Art

Two implementations of frequency dependant impedances are outlined below. First, biasing for a PIN diode. PIN diodes can be thought of as light controlled current sources. For differential sensing one or both sides of the PIN diode must be AC coupled to a differential transimpedance amplifier (FIG. 3B). For typical data rates (ATM, FDDI) the lower cutoff needs to be around 200 KHz. In order to allow the use of an on die AC coupling capacitor in the range of about 10 pF a large input impedance is required. Use of resistors (FIG. 2B) is not feasible since the PIN can have DC current approaching 1 mA which would prohibit the use of large resistors with a 5 V supply. Diode biasing (FIG. 2C) is also unacceptable because it would require off-chip capacitors since the diodes have a low impedance for small signals. Inductors (FIG. 2A) also would require off-chip components.

Another scenario outlined below includes biasing an MR (magneto-resistive) head. Typically, one side of the head is connected to a current source while the other side of the head, or common mode voltage, is held at a voltage by an amplifier. Ideally, the amp has a current source output. A common problem with a current source output is that an inverting device has a large gain from its gate/base to its drain/collector due to the high impedance of the current source biasing the MR. This gain cause problems when trying to stabilize the amplifier. "Millering" the output device is not an option since the output impedance will go down as the output device is AC coupled into a diode. Off chip capacitors are typically frowned upon because of packaging constraints.

The present invention is especially helpful when a large impedance is required while biasing a device which needs a variable or DC current to operate.

SUMMARY OF THE INVENTION

The solution for the PIN diode is to use a low pass filter to regulate the gate/source or base/emitter voltage of a device. This allows a low impedance point at DC currents while becoming a high impedance as the filter engages. This minimizes voltage drop across the PIN while maintaining a high voltage bias necessary to maximize PIN responsivity, which responsivity increases with reverse bias. The high impedance on the $V_{CC}$ side of the PIN diode improves power supply noise rejection.

The solution for biasing the MR head is to use the invention in series with a low impedance amplifier such that it acts much like an inductor. Attention must be paid to the frequency response on the amplifier/invention combination but it has been shown to be functional and effective in hardware.

The frequency dependant impedance circuits described herein do not require external capacitors for low frequency response or stability. A low frequency pole of about 200 KHz can be met using integrated capacitors.

Other features and advantages of this invention will become apparent from the following detailed description of the presently preferred embodiment of the invention, taken in conjunction with the accompanying drawings.

BRIEF DESCRIPTION OF THE DRAWINGS

FIGS. 3A–C illustrate implementations of one of the frequency dependent impedance circuits of FIG. 1 for biasing a PIN diode.

BEST MODE FOR CARRYING OUT THE INVENTION

Referring to FIGS. 1A–H, several different embodiments of frequency dependent impedance apparatuses are shown. Several implementation examples are outlined below. In the figure, input nodes are illustrated at the top of each device, and output nodes at the bottom. In each apparatus impedance varies as follows: the RC network coupled to the transistor (s) acts as a low pass filter allowing DC current, or low frequency signals, to pass. As frequency increases and the filter engages, the device gain is reduced as in an inductor. Apparatuses A–D are interchangeable as are apparatuses E–H in the following example implementations.

Pin Diode Example

Figure 1A:
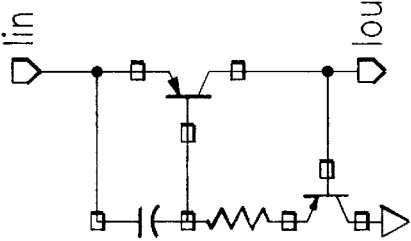
FIGS. 1A–H illustrate several inventive embodiments of the present invention.
Figure 1B:
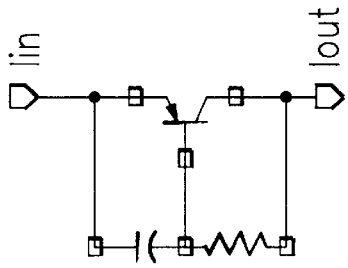
Figure 1C:
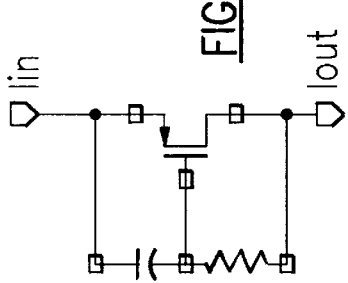
Figure 1D:
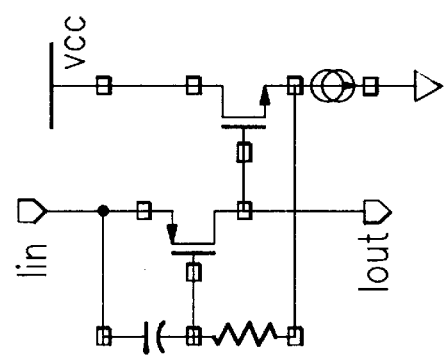
Figure 1E:
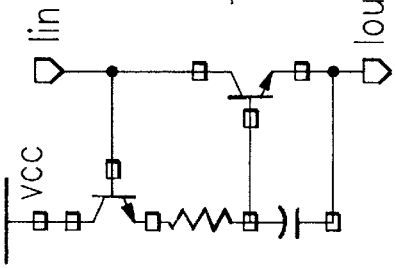
Figure 1F:
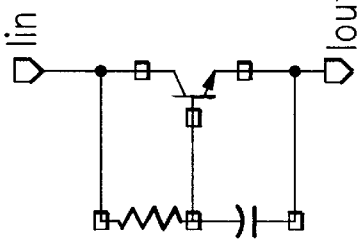
Figure 1G:
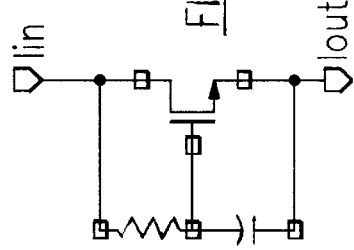
Figure 1H:
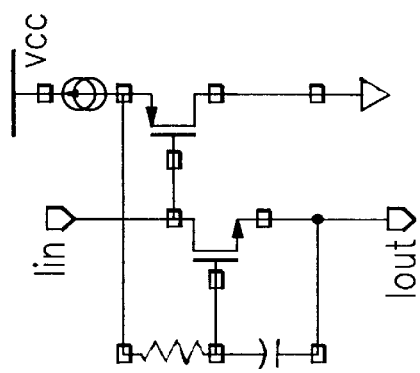
Figure 2:
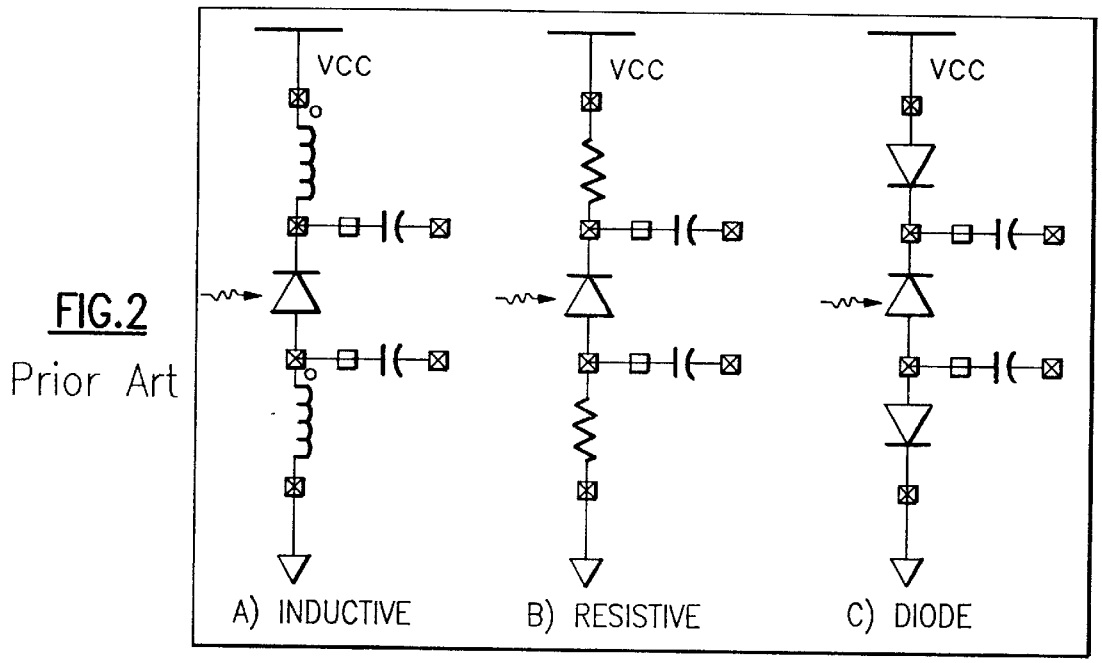
FIGS. 2A–C illustrate prior art circuits for biasing a PIN diode.
Figure 3A:
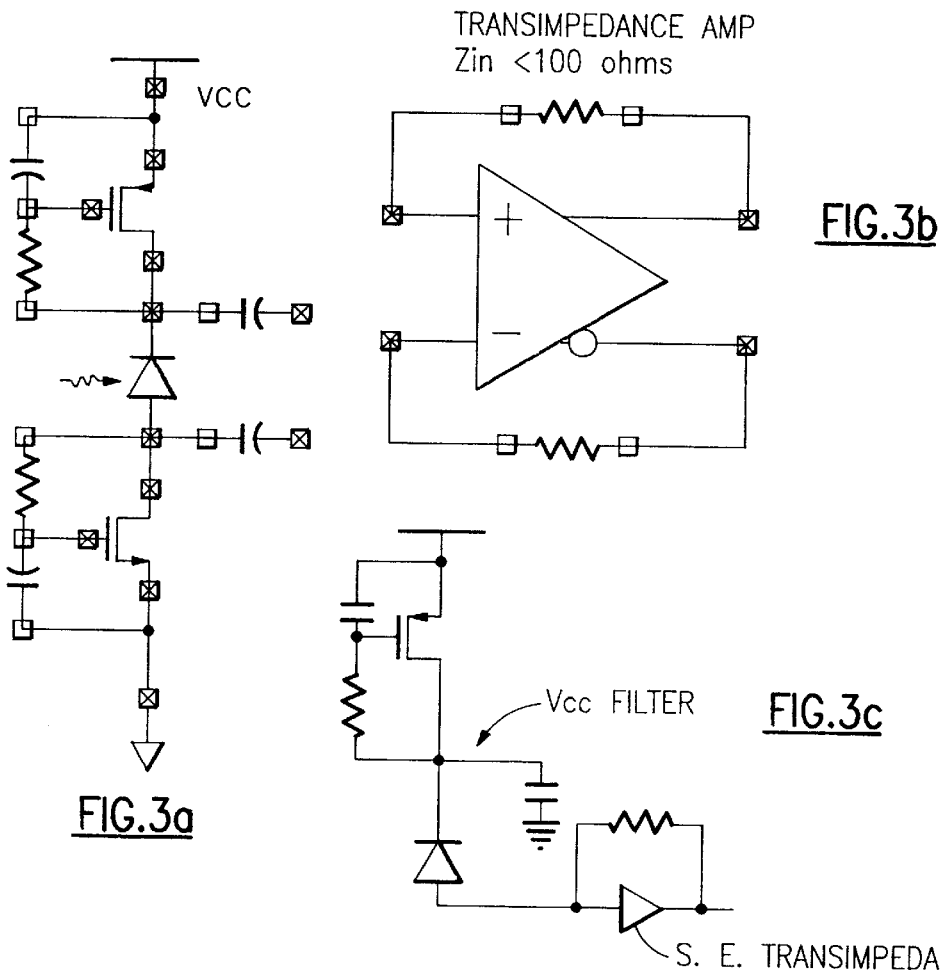

Referring to FIG. 3A, the PIN diode, in general, provides better response, i.e. current output, the higher the DC voltage across it. Ideally, the diode presents a low DC resistance while providing high impedance points for capacitively coupling the PIN diode output current into a transimpedance amplifier over a wide range of operating frequencies. The resistors and capacitor sizes are selected based on the typical operating frequency of the PIN device illustrated. The PIN diode biasing structure of FIG. 3A can be integrated entirely on-chip without requiring excessively large components and without dissipating an excessive amount of power. Also, the bottom of the diode may be coupled directly to ground and the transimpedance amp operated as a single input amplifier. In yet another implementation, the bottom of the PIN diode could be coupled directly to a S.E. transimpedance amplifier and the invention used as part of a supply filter (FIG. 3C).

MR Head Example

Figure 4:
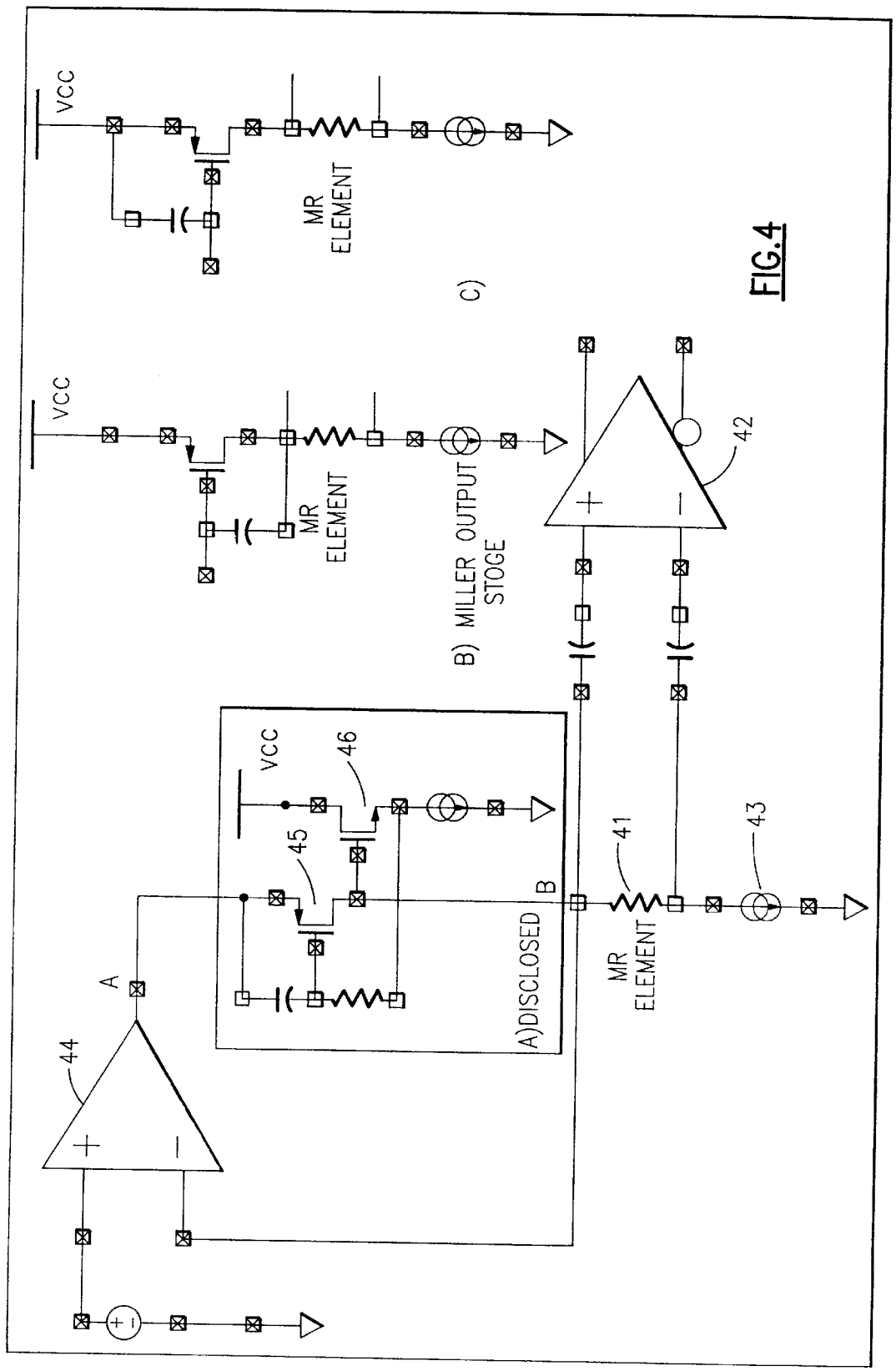
FIG. 4A illustrates an implementation of one of the frequency dependent impedance circuits of FIG. 1 for biasing an MR element.
FIGS. 4B–C illustrate typical alternatives.

Referring to the MR head embodiment of FIG. 4, for voltage sensing across the MR element it is optimal to bias the MR element with two complimentary current sources (providing high impedance relative to MR resistance). One current source is typically fixed, the other is controlled by a feedback loop to regulate the MR element common mode voltage at some voltage typically near ground. The output of the current source in the feedback loop is typically a drain/collector of a P type device. The difficulty comes in compensating the loop. The gain from the gate/base to the source/collector is quite high as it is driving into a current source.

FIG. 4B shows a typical solution to this problem by using a Miller type multiplier. This will stabilize the loop at the expense of lowering the output impedance by essentially diode connecting the output device at high frequency, which is an undesirable method. The present invention provides a high output impedance at high frequencies.

FIG. 4C illustrates another approach but, again, the gain of the output stage is quite high, and a large external capacitor would be required to stabilize the loop, although the output impedance of the device would not be affected.

Referring to the inventive frequency dependant impedance device shown in the dashed box of FIG. 4A (identical to that illustrated in FIG. 1D), the device is placed is series with a low output impedance amplifier 44 that has a narrow unity gain bandwidth. The output device's 45 impedance will rise with frequency as the RC filter holds its $V_{GS}$ constant. The device has no voltage gain and therefore makes the loop easy to stabilize using integrated capacitors. Because currents through the MR element are typically greater than those in the PIN diode example above, a second transistor 46 is added to minimize the voltage drop ($V_{DS}$) across transistor 45 (by an amount equal to $V_T$ of 46), providing more headroom for that device.

The impedance apparatus shown in the figure provides a high impedance point at the top B of the MR element 41, to better match the high impedance of the current source 43, thus, improving coupling of the signal across the MR element into the amplifier 42 and improving its signal noise rejection.

Alternative Embodiments

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

What is claimed is:

1. Apparatus comprising:

a photosensitive device which becomes less resistive to current flowing therethrough in response to increasing light energy impinging thereon;

a first transistor having a first contact coupled to a first terminal of the photosensitive device and a second contact coupled to a node having a first voltage potential;

a first resistor and a first capacitor in series coupled to the node having the first voltage potential;

a node between the first resistor and the first capacitor coupled to a third contact of the first transistor;

a second transistor having a second contact coupled to a first current source, a first contact coupled to the node having the first voltage potential, and a third contact coupled to the first terminal of the photosensitive device, the second contact of the second transistor also coupled to the first resistor;

a third transistor having a first contact coupled to a second terminal of the photosensitive device and a second contact coupled to a node having a second voltage potential;

a second resistor and a second capacitor in series coupled to the node having the second voltage potential;

a node between the second resistor and the second capacitor coupled to a third contact of the first transistor; and a fourth transistor having a second contact coupled to a second current source, a first contact coupled to the node having the second voltage potential, and a third contact coupled to the second terminal of the photosensitive device, the second contact of the fourth transistor also coupled to the resistor.

2. Apparatus comprising:

a photosensitive device which becomes less resistive to current flowing therethrough in response to increasing light energy impinging thereon;

a first transistor having a first contact coupled to a first terminal of the photosensitive device and a second contact coupled to a node having a first voltage potential;

a resistor and a capacitor in series coupled to the node having the first voltage potential;

a node between the resistor and the capacitor coupled to a third contact of the first transistor;

a second transistor having a second contact coupled to a current source, a first contact coupled to the node having the first voltage potential, and a third contact coupled to the first terminal of the photosensitive device, the second contact of the second transistor also coupled to the resistor;

a second terminal of the photosensitive device coupled to a node having a second voltage potential; and an amplifier coupled to the first terminal of the photosensitive device for amplifying a voltage signal across the photosensitive device.

3. Apparatus comprising:

an input node coupled to a first voltage terminal and an output node;

a first transistor coupled to both the input node and the output node;

a capacitor, a resistor, and a second transistor all in series coupled to the input node and the output node in parallel with the first transistor;

a node between the resistor and capacitor coupled to the first transistor, the second transistor also coupled to a second voltage terminal;

a photodiode having a first end and a second end;

an amplifier; and the first end of the photodiode coupled to the output node and the second end of the photodiode coupled to a second voltage terminal, the amplifier coupled to the first end of the photodiode for amplifying a voltage signal across the photodiode.

* * * * *